United States Patent
Caprarola et al.

(10) Patent No.: US 9,214,318 B1
(45) Date of Patent: Dec. 15, 2015

(54) ELECTROMAGNETIC ELECTRON REFLECTOR

(71) Applicant: INTERNATIONAL BUSINESS MACHINES CORPORATION, Armonk, NY (US)

(72) Inventors: Eric J. Caprarola, Essex Junction, VT (US); Robert C. Churchill, Graniteville, VT (US); Joseph R. Greco, South Burlington, VT (US); Nicholas Mone, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/340,744

(22) Filed: Jul. 25, 2014

(51) Int. Cl.
  *H01J 37/00* (2006.01)
  *H01J 37/30* (2006.01)
  *H01J 37/147* (2006.01)
  *H01J 37/317* (2006.01)

(52) U.S. Cl.
  CPC ........... *H01J 37/3007* (2013.01); *H01J 37/147* (2013.01); *H01J 37/3171* (2013.01)

(58) Field of Classification Search
  USPC .................................................. 250/396 R
  See application file for complete search history.

(56) References Cited

U.S. PATENT DOCUMENTS

| | | | |
|---|---|---|---|
| 3,730,970 A | 5/1973 | Johnson | |
| 4,563,587 A | 1/1986 | Ward et al. | |
| 4,584,429 A | 4/1986 | Raketti et al. | |
| 5,483,077 A | 1/1996 | Glavish | |
| 5,969,366 A | 10/1999 | England et al. | |
| 7,622,724 B2 | 11/2009 | Chang et al. | |
| 7,629,590 B2* | 12/2009 | Horsky et al. | 250/423 R |
| 7,791,047 B2 | 9/2010 | Horsky et al. | |
| 7,842,931 B2 | 11/2010 | Satoh et al. | |
| 8,410,704 B1 | 4/2013 | Cooley et al. | |
| 8,481,960 B2 | 7/2013 | Radovanov et al. | |
| 9,006,690 B2* | 4/2015 | Colvin et al. | 250/492.21 |
| 2014/0375209 A1* | 12/2014 | Russ et al. | 315/111.91 |

FOREIGN PATENT DOCUMENTS

| | | |
|---|---|---|
| CN | 103219104 A | 7/2013 |
| JP | 58-223248 | 12/1983 |

* cited by examiner

*Primary Examiner* — Phillip A Johnston
(74) *Attorney, Agent, or Firm* — Schmeiser, Olsen & Watts; Steven Meyers (57) ABSTRACT

An electromagnetic electron reflector, an ion implanter having an electromagnetic reflector and a method of implantation using the ion implanter. The electromagnetic electron reflector includes a frame; permanent magnets within the frame; a center aperture within the frame and electrically isolated by first gaps from the frame and the permanent magnets and fixed in position by dielectric feed throughs, first cup shields integrally formed on the top and bottom edges of the center aperture, the dielectric feed throughs nested within the first cup shields; second cup shields integrally formed on inside surfaces of the top and bottom of the frame, the second cup shields nested within respective first cup shields; entrance and exit apertures attached to the frame and an electrical conductor passing through at least one of the dielectric feed throughs and electrically contacting the center aperture.

20 Claims, 8 Drawing Sheets

ELECTROMAGNETIC ELECTRON REFLECTOR

BACKGROUND

The present invention relates to the field of ion implantation; more specifically, it relates to an electromagnetic electron reflector for high current ion implantation systems.

One step in the fabrication of advanced integrated circuits requires high current ion implantations. A problem with high current implantations is formation of an electrically conductive coating over high voltage feed throughs of the electromagnetic electron reflector of the ion implantation system. This coating causes electrical shorts and erratic beam stability. The present solution is to break the high vacuum of the system and change or clean the electromagnetic electron reflector. Not only is this expensive and time consuming but breaking the high vacuum of the system drives higher defects due to the hygroscopic properties of the residual coatings. Accordingly, there exists a need in the art to mitigate the deficiencies and limitations described hereinabove.

BRIEF SUMMARY

A first aspect of the present invention is an electromagnetic electron reflector, comprising: an electrically conductive frame; permanent magnets within the frame and on opposite sides of the frame; an electrically conductive center aperture contained entirely within the frame and electrically isolated by first gaps from the frame and the permanent magnets and fixed in position by dielectric feed throughs passing through openings in a top and in a bottom of the frame, the dielectric feed throughs physically contacting a top and a bottom edge of the center aperture; first cup shields integrally formed on the top and bottom edges of the center aperture, the dielectric feed throughs nested within the first cup shields; second cup shields integrally formed on inside surfaces of the top and bottom of the frame, the second cup shields nested within respective first cup shields; electrically conductive entrance and exit apertures attached to the frame on opposite sides of the center aperture, the entrance and exit apertures electrically isolated from the center aperture by second gaps; and an electrical conductor passing through at least one of the dielectric feed throughs and electrically contacting the center aperture.

A second aspect of the present invention is an ion implantation system comprising: a plasmas ion source, an ion extractor, an analyzing electromagnetic, an electromagnetic electron reflector, an electron shower aperture and a target stage; and the electron reflector, comprising: an electrically conductive frame; permanent magnets within the frame and on opposite sides of the frame; an electrically conductive center aperture contained entirely within the frame and electrically isolated by first gaps from the frame and the permanent magnets and fixed in position by dielectric feed throughs passing through openings in a top and in a bottom of the frame, the dielectric feed throughs physically contacting a top and a bottom edge of the center aperture; first cup shields integrally formed on the top and bottom edges of the center aperture, the dielectric feed throughs nested within the first cup shields; second cup shields integrally formed on inside surfaces of the top and bottom of the frame, the second cup shields nested within respective first cup shields; electrically conductive entrance and exit apertures attached to the frame on opposite sides of the center aperture, the entrance and exit apertures electrically isolated from the center aperture by second gap; and an electrical conductor passing through at least one of the dielectric feed throughs and electrically contacting the center aperture.

A third aspect of the present invention is a method of ion implanting semiconductor wafers comprising: providing an ion implantation system comprising a plasmas ion source, an ion extractor, an analyzing electromagnetic, an electromagnetic electron reflector, an electron shower aperture and a target stage, the electron reflector, comprising: an electrically conductive frame; permanent magnets within the frame and on opposite sides of the frame; an electrically conductive center aperture contained entirely within the frame and electrically isolated by first gaps from the frame and the permanent magnets and fixed in position by dielectric feed throughs passing through openings in a top and in a bottom of the frame, the dielectric feed throughs physically contacting a top and a bottom edge of the center aperture; first cup shields integrally formed on the top and bottom edges of the center aperture, the dielectric feed throughs nested within the first cup shields; second cup shields integrally formed on inside surfaces of the top and bottom of the frame, the second cup shields nested within respective first cup shields; electrically conductive entrance and exit apertures attached to the frame on opposite sides of the center aperture, the entrance and exit apertures electrically isolated from the center aperture by second gaps; and an electrical conductor passing through at least one of the dielectric feed throughs and electrically contacting the center aperture; passing an ion beam exiting the analyzing electromagnetic through the electromagnetic electron reflector while applying a voltage to the center aperture, the voltage sufficient to remove a sheath of electrons from the ion beam; passing the beam through the electron shower aperture; and impinging the beam from the electron shower on a semiconductor wafer.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 5A is a cross-section view through line 5A-5A of the top view of FIG. 5B of the top and bottom brackets of an electromagnetic electron reflector according to an embodiment of the present invention;

DETAILED DESCRIPTION

The embodiments of the present invention provide improved designs for ion implantation high energy electron removal apertures known as electromagnetic electron reflectors. In systems that implant species of boron, phosphorus and arsenic the normal maintenance frequency of electromagnetic electron reflectors due to buildup of electrically conductive coatings on the surfaces of the electromagnetic electron reflectors is about once every three months. However, in high current (e.g., 4 to 125 milliamps) argon implant systems (e.g., 100 KeV and 1E16 atom/cm$^2$) the maintenance frequency can be as high as once a week due to buildup of electrically conductive coatings. The embodiments of the present invention provide electromagnetic electron reflectors having minimum space between the entrance and exit apertures and central aperture, feed throughs with increased conductance paths to ground, feed throughs that have annular grooves and rings, and nested shielding around the feed throughs.

Figure 1:
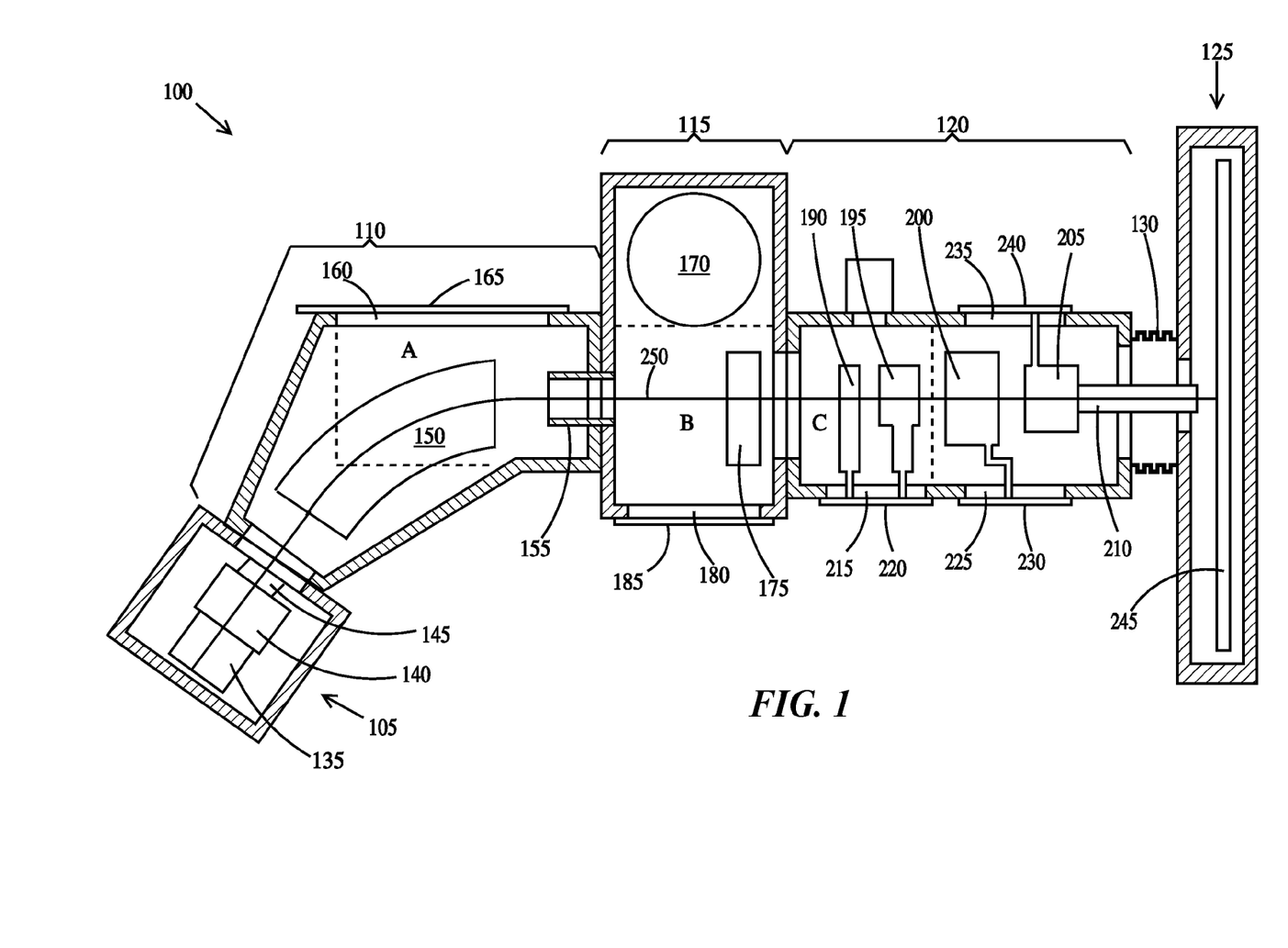
FIG. 1 is a schematic top view of an exemplary ion implantation system according to an embodiment of the present invention.

FIG. 1 is a schematic side view of an exemplary ion implantation system according to an embodiment of the present invention. In FIG. 1, an ion implantation system 100 includes a beam generation chamber 105, an analyzer chamber 110, a pumping chamber 115, a resolving chamber 120 and a wafer chamber 125 connected to resolving chamber 120 by a flexible bellows 130. The sidewalls of beam generation chamber 105, analyzer chamber 110, pumping chamber 115, resolving chamber 120 and wafer chamber 125 are illustrated in sectional view; all other structures are illustrated in plan view. Beam generation chamber 105 includes an ion/plasma source 135, an extractor 140 and a beam defining aperture 145. Analyzer chamber 110 includes pole ends 150 of an electromagnet (not shown), an exit tube 155 an access port 160 and an access port cover 165. Pumping chamber 115 includes a pumping port 170, a deflector aperture 175, an access port 180 and an access port cover 185. Resolving chamber 120 includes a selectable aperture 190, a beam sampler 195, an electromagnetic electron reflector 200, an electron shower aperture 205, an electron shower tube 210, a first access port 215, a first access port cover 220, a second access port 225, a second access port cover 230, a third access port 235 and a third access port cover 240. Wafer chamber 125 includes a slideable and rotatable-stage 245 for holding semiconductor wafers.

Beam generation chamber 105, analyzer chamber 110, pumping chamber 115, resolving chamber 120 and a wafer chamber 125 are all connected together by vacuum tight seals and evacuated through pump port 170. Additional pump ports may be provided, for example in beam generation chamber 105. Wafer chamber 125 can be tilted relative to resolving chamber 120. Beam generation chamber 105, analyzer chamber 110, pumping chamber 115, resolving chamber 120 and a wafer chamber 125 are fabricated from solid or hollow cast blocks of aluminum that are bored out. Electromagnetic pole end 150 comprises iron. Electron shower tube 210 comprises graphite and is negatively charged.

In operation, an ion plasma is generated within ion source 135 and ions extracted from the ion source by extractor 140 to generate an ion beam that is projected along a beam path 250 by the electromagnet. After being passing through defining aperture 145, the ion beam is passed through analyzer chamber 110 where only ions of a predetermined charge to mass ratio exit through exit aperture 155. After passing through pumping chamber 135, selectable aperture 190, beam sampler 195, electromagnetic electron reflector 200, electron shower aperture 205, and electron shower tube 210, the ion beam strikes a substrate on stage 245.

Figure 2:
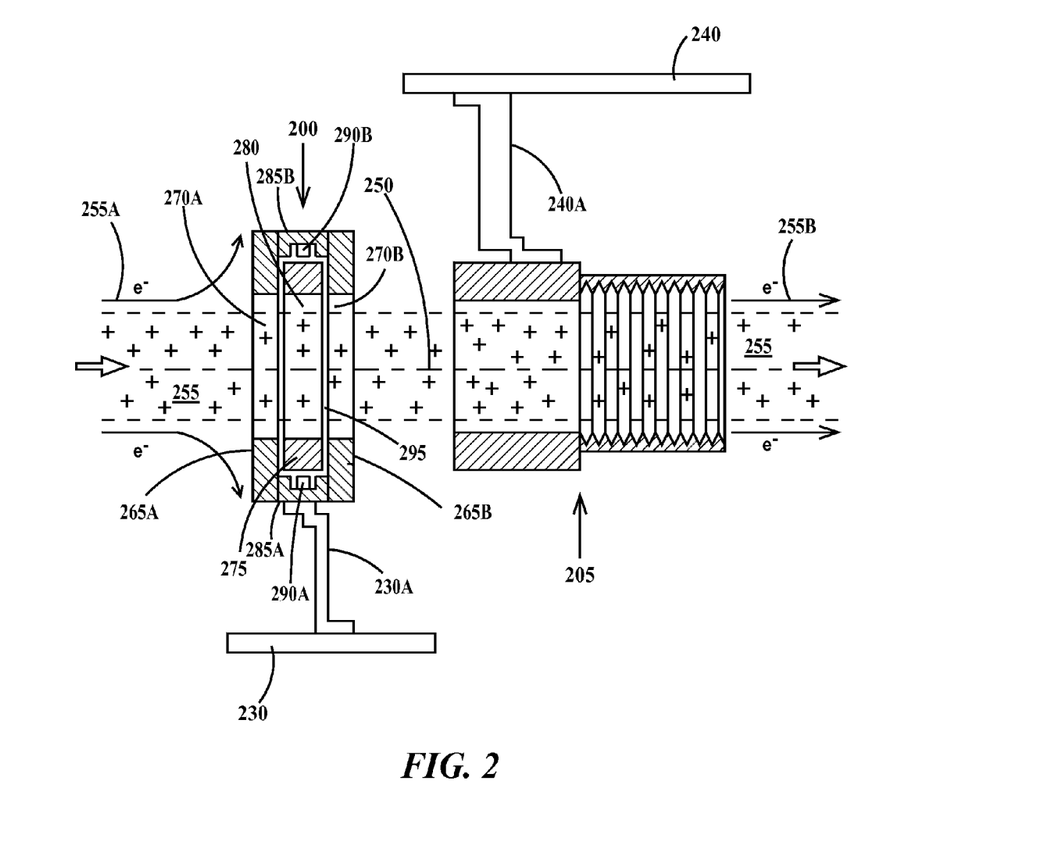
FIG. 2 is a schematic top view illustrating the function of an electromagnetic electron reflector according to an embodiment of the present invention.

FIG. 2 is a schematic top view illustrating the function of an electromagnetic electron reflector according to an embodiment of the present invention. In FIG. 2, electromagnetic electron reflector 200 is held in beam path 250 by bracket 230A attached to second access plate 230. Electron shower aperture 205 is held in beam path by bracket 240A attached to third access plate 240. An ion beam 255 is comprised of positively charged ion (e.g., Ar$^+$ ions) and is circular in cross-section. Ion beam 255 is surrounded by a sheath of high energy (e.g., greater than 10 KeV) electrons 255A that are removed from beam 255 by electromagnetic electron reflector 200. As ion beam 255 passes through electron shower aperture 205, a sheath of low energy (e.g., 2.5 KeV or less) electrons 255 is formed around the ion beam.

Electromagnetic electron reflector 200 comprises an entrance aperture 265A having a circular opening 270A, an exit aperture 265B having a circular opening 270B and a center aperture 275 between the entrance and exit apertures and having a circular opening 280. Openings 270A, 270B and 280 are, in one example, the same diameter and coaxially aligned along beam path 250. Entrance aperture 265A and exit aperture 265B are spaced apart and attached by opposite first and second side brackets 285A and 285B. First and second side brackets 285A and 285B have slots (see FIG. 6) for holding permanent magnets 290A and 290B. Central aperture 275 is held in position by top and bottom brackets (not shown, see FIGS. 5A, 5B, 7 and 8) that attached to first and second sides 285A and 285B. Central aperture 275 is electrically isolated from entrance and exit apertures 265A and 265B, first and second side brackets 285A and 285B, magnets 290A and 290B by a gap 295. In one example, gap 295 is no greater than that required to prevent arcing between central aperture 275 and entrance and exit apertures 265A and 265B in a vacuum at a designed operating differential voltage applied between the central aperture (e.g., negative at least 2.5 KeV) and the outer apertures (e.g., ground). Central aperture 275 is also electrically isolated from the top and bottom brackets as shown on FIG. 7.

In one example, entrance and exit apertures 265A and 265B and central aperture 275 are formed from graphite. In one example, first and second side brackets 285A and 285B are formed from stainless steel. In one example, entrance and exit apertures 265A and 265B are attached to first and second side brackets 285A and 285B by screws (not shown). In use, entrance and exit apertures 265A and 265B, first and second side brackets 285A and 285B, magnets 290A and 290B and top and bottom brackets (not shown, see FIGS. 5A, 5B, 7 and 8) are held at ground potential and central aperture 275 is held at a negative potential (e.g., negative at least 2.5 KeV).

Figure 3A:
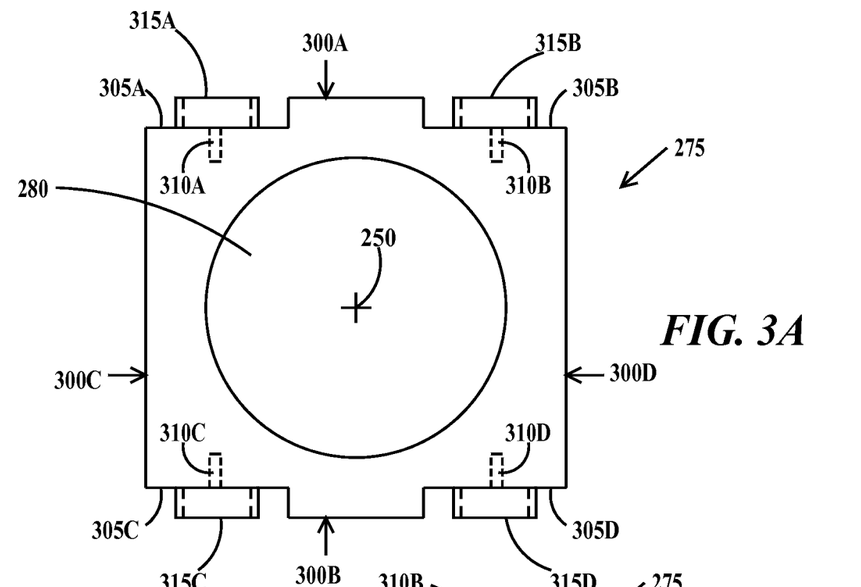
FIG. 3A is a front view and FIG. 3B is a top view of an exemplary center aperture of an electromagnetic electron reflector according to an embodiment of the present invention.
Figure 3B:
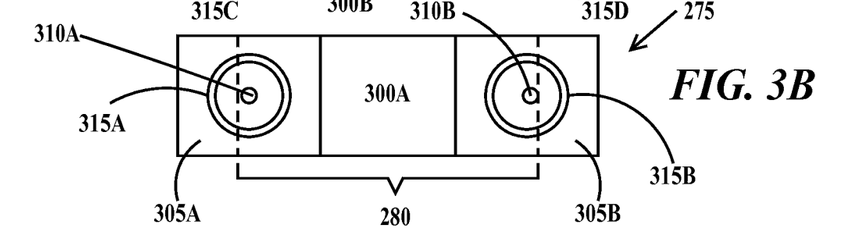

FIG. 3A is a front view and FIG. 3B is a top view of an exemplary center aperture of an electromagnetic electron reflector according to an embodiment of the present invention. In FIGS. 3A and 3B, central aperture 275 has a top 300A, a bottom 300B and opposite sides 300C and 300D. Opening 280 is centered between sides 300A, 300B, 300C and 300D. Top 300A includes notches 305A and 305B adjoining sides 300C and 300D respectively. Bottom 300B includes notches 305C and 305D adjoining sides 300C and 300D respectively. Threaded holes 310A and 310B are formed in top side 300A in respective notches 305A and 305B and threaded holes 310C and 310D are formed in bottom side 300B in respective notches 305C and 305D. In one example, aperture 275 is between 3 and 4 inches wide, between 3 and 4 inches high, between 0.5 and 0.75 inches thick and opening 280 has a diameter between 2 and 3 inches. In a preferred embodiment, cup shields (raised circular rings) 315A and 315B are integrally formed on top 300A in respective notches 305A and 305B and cup shields 315C and 315D are integrally formed on bottom 300A in respective notches 305C and 305D. Threaded holes 310A, 310B, 310C and 310D are formed in the center of cup shields 315A, 315B, 315C and 315D respectively.

Figure 4:
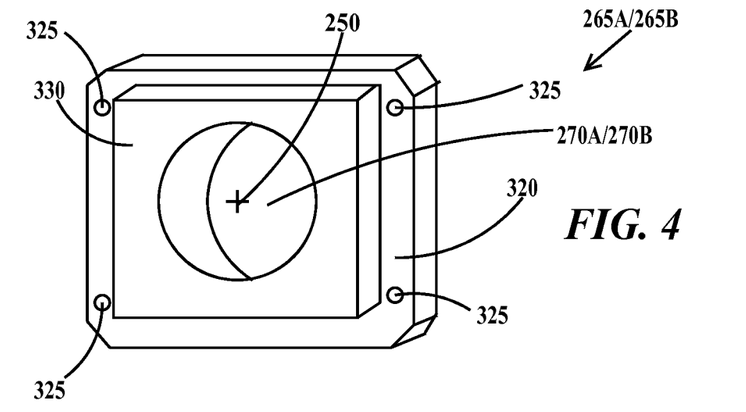
FIG. 4 is an isometric view of the entrance and exit apertures of an electromagnetic electron reflector according to an embodiment of the present invention.

FIG. 4 is an isometric view of the outer apertures of an electromagnetic electron reflector according to an embodiment of the present invention. In FIG. 4, entrance aperture 265A and exit aperture 265B comprise a body 320 having through holes 325. Through holes 325 allow attachment of the entrance and exit apertures to first and second side brackets 285A and 285B (see FIG. 6) using screws. Optionally, one or both of entrance aperture 265A and exit aperture 265B may include a raised region 330 adapted to recess into first and second side brackets 285A and 285B (see FIG. 6) and top and bottom brackets 335A and 335B (see FIGS. 5A and 5B) when the side, top and bottom brackets are assembled (see FIG. 7). In one example, aperture body 320 is between 3 and 4 inches wide, between 3 and 4 inches high, between 0.5 and 0.75 inches thick and openings 270A/270B have a diameter between 2 and 3 inches.

Figures 5A, 5B:
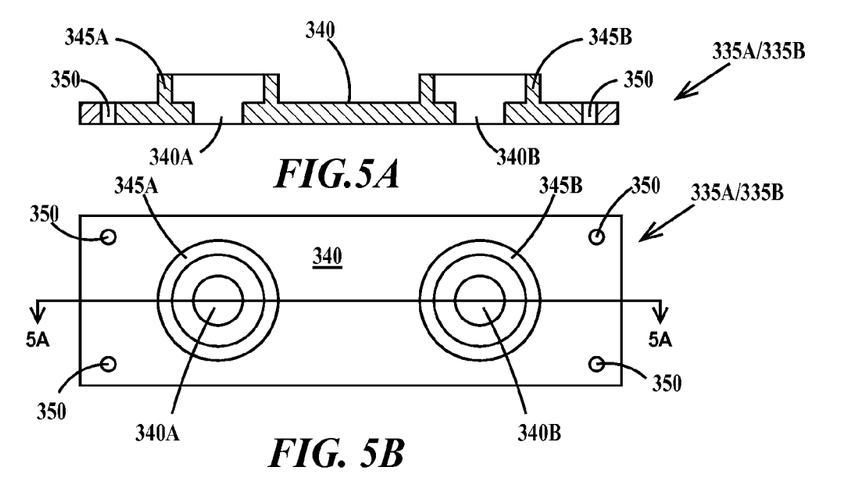

FIG. 5A is a cross-section view through line 5A-5A of the top view of FIG. 5B of the top and bottom brackets of an electromagnetic electron reflector according to an embodiment of the present invention. In FIGS. 5A and 5B each of top and bottom brackets 335A and 335B includes a body 340 having through holes 340A and 340B and through holes 350. Through holes 340A and 340B allow insertion of feed throughs through the top and bottom brackets to contact central aperture 275 as illustrated in FIG. 7 and described infra. Through holes 350 allow attachment of top and bottom brackets 335A and 335B to first and second side brackets 285A and 285B (see FIG. 6) using screws. In a preferred embodiment, cup shields (raised circular rings) 345A and 345B are integrally formed with body 340.

Figure 6:
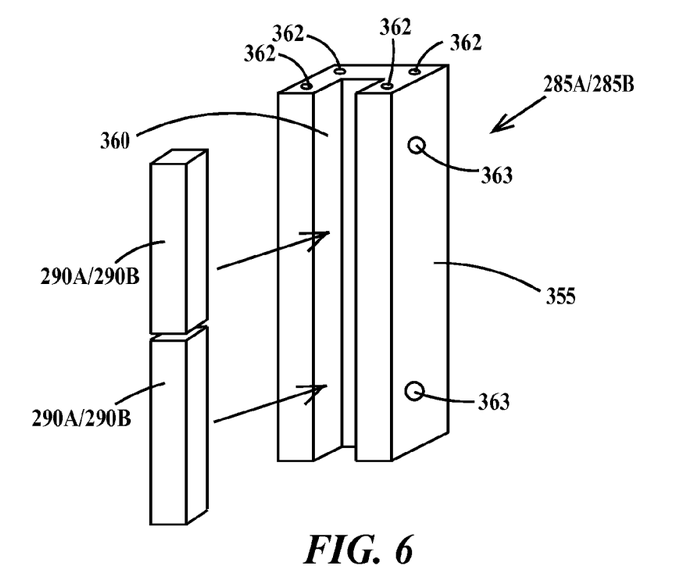
FIG. 6 is an isometric view of the side brackets of an electromagnetic electron reflector according to an embodiment of the present invention.
Figure 7:
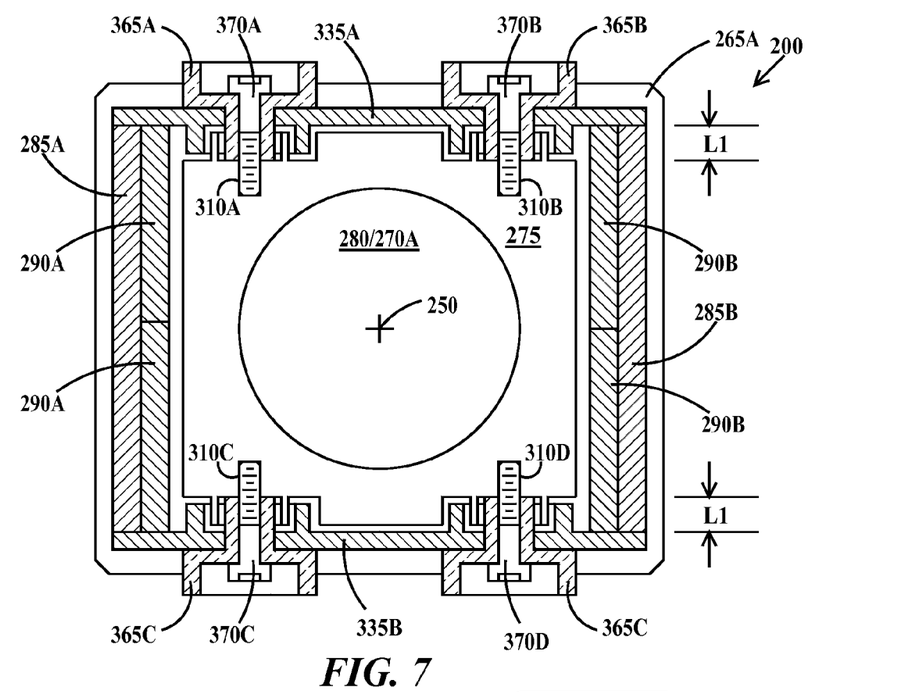
FIG. 7 is a cross-section view of an electromagnetic electron reflector according to an embodiment of the present invention.

FIG. 6 is an isometric view of the side brackets of an electromagnetic electron reflector according to an embodiment of the present invention. In FIG. 6, each of side brackets 285A and 285B have a body 355 including a longitudinal slot 360. Magnets 290A/290B fit into slot 360 of respective side brackets 285A and 285B. Formed in both ends of body 355 are threaded holes 362 that allow attachment of top and bottom plates 335A and 335B (See FIGS. 5A and 5B) to side brackets 285A and 285B with screws. Formed in both sides of body 355 are threaded holes 363 that allow attachment of entrance and exit apertures 265A and 265B (See FIG. 4) to side brackets 285A and 285B with screws.

FIG. 7 is a cross-section view of an electromagnetic electron reflector according to an embodiment of the present invention. In FIG. 7, top and bottom brackets 335A and 335B have been joined to side brackets 285A and 285B to form a frame. Entrance aperture 265A has been attached to this frame and magnets 290A and 290B and central aperture 275 have been placed inside the frame. Central aperture 275 is secured in position by four dielectric feed throughs 365A, 365B, 365C and 365D secured to top and bottom plates 335A and 335B by screws 310A, 310B, 310C and 310D that pass through the centers of the feed throughs and screw into central aperture 275. Screws 310A and 310B press feed throughs 365A and 365B against the top surface of top bracket 335A and the top edge of central aperture 275. Screws 310C and 310D press feed throughs 365C and 365D against the top surface of bottom bracket 335B and the bottom edge of central aperture 275.

Figure 10:
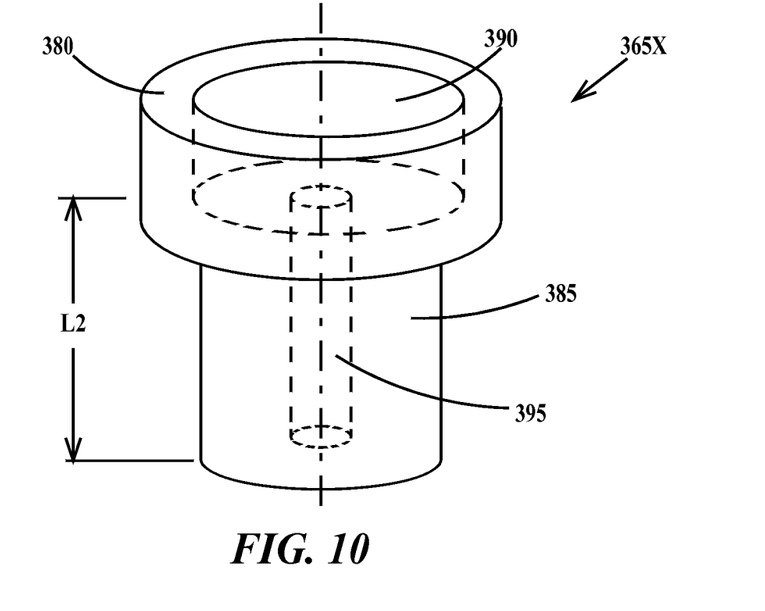
FIG. 10 is an isometric view of a feed through according to an embodiment of the present invention.

Turning to FIG. 10, FIG. 10 is an isometric view of a feed through according to an embodiment of the present invention. In FIG. 10 an exemplary feed through 365X, has a circular ring portion 380 integrally formed with a smaller diameter circular barrel portion 385. An opening 390 in ring portion 380 abuts a smaller diameter opening 395 in barrel portion 385. Barrel portion 385 has a length L2.

Returning to FIG. 7, the distance between the bottom surface of top bracket 335A and the top edge of central aperture 275 is L1 and the distance between the bottom surface of bottom bracket 335B and the bottom edge of central aperture 275 is also L1. With L2 greater than L1, feed throughs 365A, 365B, 365C and 365D act as standoffs, preventing central aperture 275 from touching top or bottom brackets 335A and 335B, side brackets 285A and 285B, magnets 290, entrance aperture 265A and exit aperture 265B (not shown, see FIG. 2). Note gap 295 between entrance and exit apertures 265A and 265B and central aperture 275 shown in FIG. 2 is maintained by feed throughs 365A, 365B, 365C and 365D as well. In one example, feed throughs 365A, 365B, 365C and 365D are formed from a polyimide polymer. In one example, feed throughs 365A, 365B, 365C and 365D are formed from Vespel® manufactured by Dupont. Feed throughs 365A, 365B, 365C and 365D may take the shape of any of those illustrated in FIGS. 9, 10, 11A, 11B and 11C or may include various combinations of features of the feed throughs in FIGS. 11A, 11B and 11C.

Figure 8:
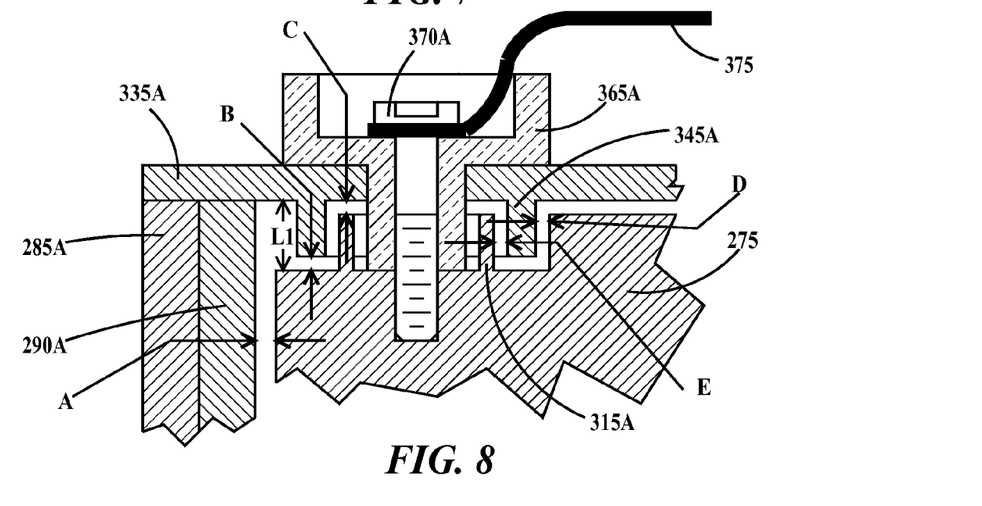
FIG. 8 is a cross-section view of the upper left hand corner of FIG. 7.

FIG. 8 is a cross-section view of the upper left hand corner of FIG. 7. FIG. 8 is representative of all four corners of electromagnetic electron reflector 200 of FIG. 7. In FIG. 8, upper bracket 335A includes optional cup shield 345A and central aperture 275 includes optional cup shield 315A. A gap "A" is maintained between magnet 290A and central aperture 275. A gap "B" is maintained between cup shield 345A of top bracket 335A and central aperture 275. A gap "C" is maintained between cup shield 315A of central aperture 275 and top bracket 335A. A gap "D" is maintained between central aperture 275 and cup shield 345A of top bracket 335A. Cup shield 315A of central aperture 275 is interposed between feed through 365A and cup shield 345A of top bracket 335A and a gap "E" is maintained between cup shield 315A and cup shield 345A. In other words, screw 370A is nested within feed through 365A which is nested within cup shield 315A which is nested within cup shield 345A with no electrically conductive surface touching. Cup shield 315A does not touch cup shield 345A or plate 335A or feed through 365A. Cup shield 345A does not touch aperture 275 or cup shield 315A. Cup shield 315A and cup shield 345A make it difficult for contaminants to coat the surfaces of feed through 365A by eliminating the possibility of direct bean strikes. In one example, gaps "A", "B", "C", "D" and "E" are no greater than that required to prevent arcing between central aperture 275 and any surrounding electrical conductor (e.g., brackets, exit and entrance apertures, screws) at a designed operating differential voltage applied between the central aperture and the entrance and exit apertures (e.g., ground). At a designed differential voltage of −2.5 KeV the gaps are 0.0625 inches or greater to maintain proper vacuum gap insulation. Also shown in FIG. 8 is a wire 375 that connects a negative potential to central aperture 275 through screw 370A.

Figure 9A:
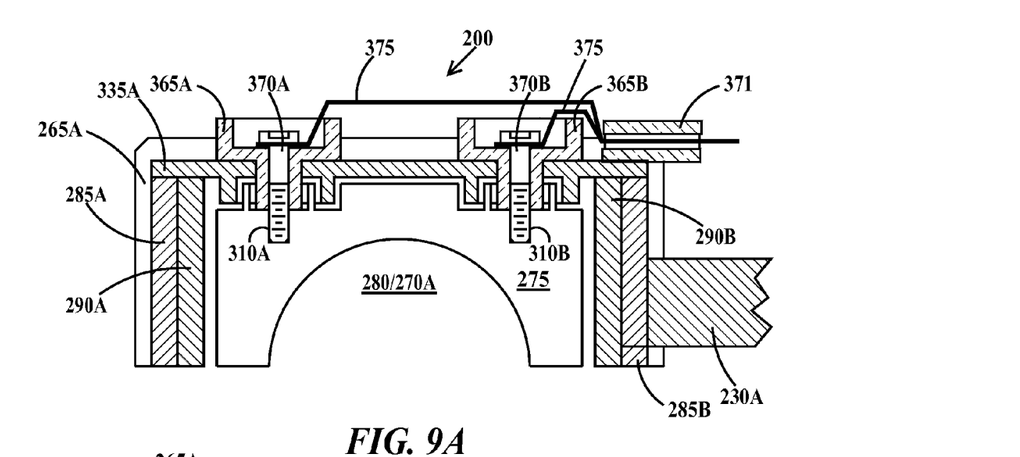
FIGS. 9A, 9B and 9C illustrate additional features of a wire clamp.
Figure 9B:
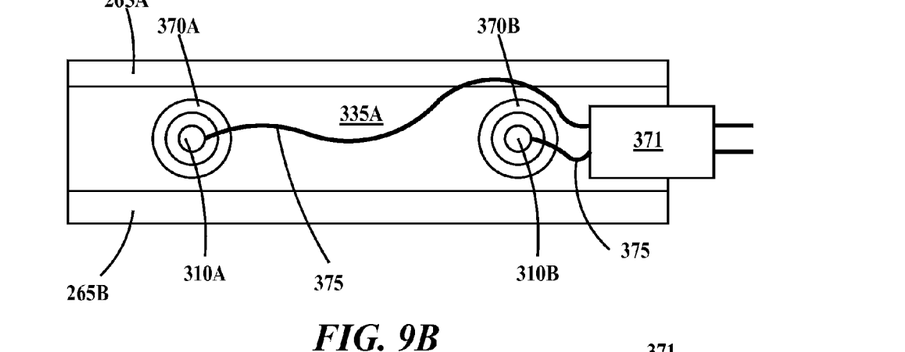
Figure 9C:
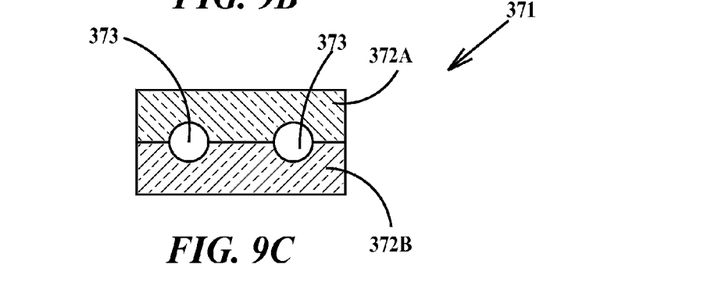

FIGS. 9A, 9B and 9C illustrate additional features of a wire clamp. FIG. 9A is similar to FIG. 7, but illustrates how insulated wires 375 are fixed to electromagnetic electron reflector 200 by an insulated clamp 371. FIG. 9B is a top view of electromagnetic electron reflector 200 and shows wires 375 passing through insulated clamp 371. FIG. 9C is a cross-sectional view through insulated clamp 371 and shows the clamp comprises an upper section 372A and a lower section 372B each having a pair of notches that form passages 373 for the wires.

Figure 11:
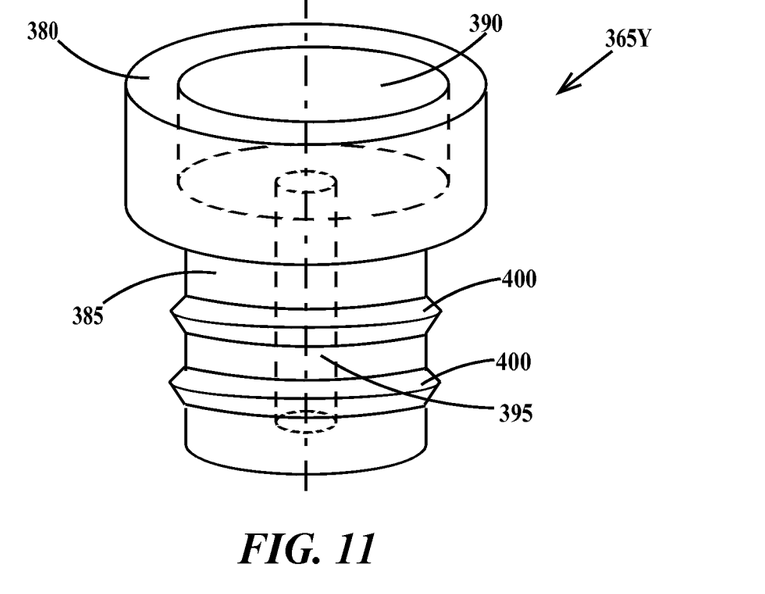
FIG. 11 is an isometric view of a feed through according to an embodiment of the present invention.

FIG. 11 is an isometric view of a feed through according to an embodiment of the present invention. The only difference between feed through 365Y of FIG. 11 and feed through 365X of FIG. 10 is feed through 365Y includes raised annular rings 400 on circular barrel portion 385. Annular rings 400 increase the surface distance an arc would have to travel along the barrel portion. While two annular rings 400 are illustrated in FIG. 10, there may be only one or more than two.

Figures 12A, 12B, 12C:
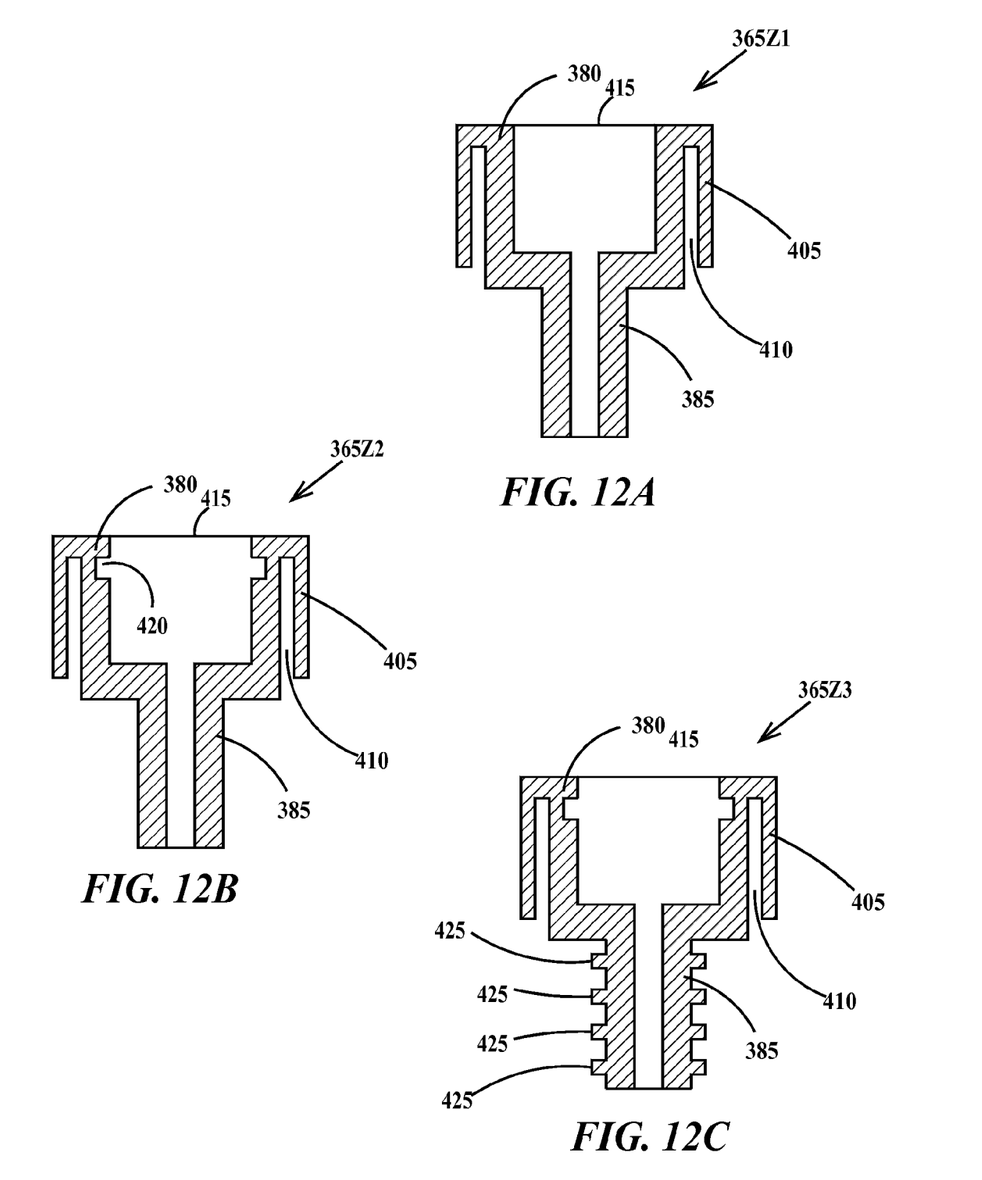
FIGS. 12A-12C are cross-sectional views through feed throughs according to an embodiment of the present invention.

FIGS. 12A, 12B and 12C are cross-sectional views through feed throughs according to an embodiment of the present invention. In FIG. 12A, an feed through 365Z1 includes a circular annular ring 405 around and integrally formed with circular ring portion 380 and separated from the ring portion by a circular annular gap 410. Annular ring 405 is not as long as ring portion 380 when measured from the top surface 415 of feed through 365X. In FIG. 12B, a feed through 365Z2 is similar to feed through 365Z1 except for a circular annular slot 420 formed in the inside wall of circular ring portion 380. In FIG. 12C, an feed through 365Z3 is similar to feed through 365Z2 except for an additional circular annual rings 425 integral with and formed in the outside wall of circular barrel portion 385. While four rings 425 are shown, there may be more or less than four rings. In another embodiment the circular rings 425 are added to feed through 365Z1.

While the embodiments of the present invention are most useful when applied to high current argon ion implanters, the embodiments of the present invention may be applied to ion implanters that run at low currents, high voltages, and implant other species such as arsenic, boron and phosphorus.

Thus the embodiments of the present invention provide having minimum space between the central and the entrance and exit apertures, feed throughs with increased conductance paths to ground, feed throughs that have annular grooves and rings, and nested shielding around the feed throughs that decrease the maintenance frequency of the electromagnetic electron reflectors.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electromagnetic electron reflector, comprising:
   an electrically conductive frame;
   permanent magnets within said frame and on opposite sides of said frame;
   an electrically conductive center aperture contained entirely within said frame and electrically isolated by first gaps from said frame and said permanent magnets and fixed in position by dielectric feed throughs passing through openings in a top and in a bottom of said frame, said dielectric feed throughs physically contacting a top and a bottom edge of said center aperture;
   first cup shields integrally formed on said top and bottom edges of said center aperture, said dielectric feed throughs nested within said first cup shields;
   second cup shields integrally formed on inside surfaces of said top and bottom of said frame, said second cup shields nested within respective first cup shields;
   electrically conductive entrance and exit apertures attached to said frame on opposite sides of said center aperture, said entrance and exit apertures electrically isolated from said center aperture by second gaps; and
   an electrical conductor passing through at least one of said dielectric feed throughs and electrically contacting said center aperture.

2. The electromagnetic electron reflector of claim 1, wherein said frame comprises an electrically conductive top plate, an electrically conductive opposite lower plate and an electrically conductive pair of sidewall channels connecting opposite distal ends of said top and bottom plates, said permanent magnets posited in slots in said sidewall channels, said openings for said dielectric feed throughs in said top and bottom plates, and said first cup shields integrally formed on said top and bottom plates.

3. The electromagnetic electron reflector of claim 1, wherein said dielectric feed throughs comprise a circular ring portion integrally formed with a circular barrel portion of smaller diameter, an opening in ring portion is open to a smaller diameter opening in said barrel portion; said barrel portion containing one or more raised annular rings.

4. The electromagnetic electron reflector of claim 1, wherein said first cup shields are formed in notches in said top and bottom edges of said center aperture.

5. The electromagnetic electron reflector of claim 1, wherein said frame is rectangular having four corners, there are four dielectric feed throughs, four respective first cup shields, four respective second cup shields, and two openings in said top of said frame and two openings in said bottom of said frame, said opening proximate to the four corners of said frame.

6. The electromagnetic electron reflector of claim 1, wherein said first and second gaps are no greater than that required to prevent arcing between said central aperture, said entrance and exit apertures, said frame in a vacuum and said permanent magnets at a designed operating differential voltage applied between the central aperture and said frame.

7. An ion implantation system comprising:
   a plasmas ion source, an ion extractor, an analyzing electromagnetic, an electromagnetic electron reflector, an electron shower aperture and a target stage; and
   said electron reflector, comprising:
     an electrically conductive frame;
     permanent magnets within said frame and on opposite sides of said frame;
     an electrically conductive center aperture contained entirely within said frame and electrically isolated by first gaps from said frame and said permanent magnets and fixed in position by dielectric feed throughs passing through openings in a top and in a bottom of said frame, said dielectric feed throughs physically contacting a top and a bottom edge of said center aperture;

first cup shields integrally formed on said top and bottom edges of said center aperture, said dielectric feed throughs nested within said first cup shields;

second cup shields integrally formed on inside surfaces of said top and bottom of said frame, said second cup shields nested within respective first cup shields;

electrically conductive entrance and exit apertures attached to said frame on opposite sides of said center aperture, said entrance and exit apertures electrically isolated from said center aperture by second gap; and an electrical conductor passing through at least one of said dielectric feed throughs and electrically contacting said center aperture.

8. The ion implantation system of claim 7, wherein said frame comprises an electrically conductive top plate, an electrically conductive opposite lower plate and an electrically conductive pair of sidewall channels connecting opposite distal ends of said top and bottom plates, said permanent magnets posited in slots in said sidewall channels, said openings for said dielectric feed throughs in said top and bottom plates, and said first cup shields integrally formed on said top and bottom plates.

9. The ion implantation system of claim 7, wherein said dielectric feed throughs comprise a circular ring portion integrally formed with a circular barrel portion of smaller diameter, an opening in ring portion is open to a smaller diameter opening in said barrel portion; said barrel portion containing one or more raised annular rings.

10. The ion implantation system of claim 7, wherein said first cup shields are formed in notches in said top and bottom edges of said center aperture.

11. The ion implantation system of claim 7, wherein said frame is rectangular having four corners, there are four dielectric feed throughs, four respective first cup shields, four respective second cup shields, and two openings in said top of said frame and two openings in said bottom of said frame, said opening proximate to the four corners of said frame.

12. The ion implantation system of claim 7, wherein said first and second gaps are no greater than that required to prevent arcing between said central aperture, said entrance and exit apertures, said frame in a vacuum and said permanent magnets at a designed operating differential voltage applied between the central aperture and said frame.

13. A method of ion implanting semiconductor wafers comprising:

providing an ion implantation system comprising a plasmas ion source, an ion extractor, an analyzing electromagnetic, an electromagnetic electron reflector, an electron shower aperture and a target stage, said electron reflector, comprising:

an electrically conductive frame;

permanent magnets within said frame and on opposite sides of said frame;

an electrically conductive center aperture contained entirely within said frame and electrically isolated by first gaps from said frame and said permanent magnets and fixed in position by dielectric feed throughs passing through openings in a top and in a bottom of said frame, said dielectric feed throughs physically contacting a top and a bottom edge of said center aperture;

first cup shields integrally formed on said top and bottom edges of said center aperture, said dielectric feed throughs nested within said first cup shields;

second cup shields integrally formed on inside surfaces of said top and bottom of said frame, said second cup shields nested within respective first cup shields;

electrically conductive entrance and exit apertures attached to said frame on opposite sides of said center aperture, said entrance and exit apertures electrically isolated from said center aperture by second gaps; and an electrical conductor passing through at least one of said dielectric feed throughs and electrically contacting said center aperture;

passing an ion beam exiting said analyzing electromagnetic through said electromagnetic electron reflector while applying a voltage to said center aperture, said voltage sufficient to remove a sheath of electrons from said ion beam;

passing said beam through said electron shower aperture; and impinging said beam from said electron shower on a semiconductor wafer.

14. The method of claim 13, wherein said frame comprises an electrically conductive top plate, an electrically conductive opposite lower plate and an electrically conductive pair of sidewall channels connecting opposite distal ends of said top and bottom plates, said permanent magnets posited in slots in said sidewall channels, said openings for said dielectric feed throughs in said top and bottom plates, and said first cup shields integrally formed on said top and bottom plates.

15. The method of claim 13, wherein said dielectric feed throughs comprise a circular ring portion integrally formed with a circular barrel portion of smaller diameter, an opening in ring portion is open to a smaller diameter opening in said barrel portion; said barrel portion containing one or more raised annular rings.

16. The method of claim 13, wherein said first cup shields are formed in notches in said top and bottom edges of said center aperture.

17. The method of claim 13, wherein said frame is rectangular having four corners, there are four dielectric feed throughs, four respective first cup shields, four respective second cup shields, and two openings in said top of said frame and two openings in said bottom of said frame, said opening proximate to the four corners of said frame.

18. The method of claim 13, wherein said first and second gaps are no greater than that required to prevent arcing between said central aperture, said entrance and exit apertures, said frame in a vacuum and said permanent magnets at a designed operating differential voltage applied between the central aperture and said frame.

19. The method of claim 13, wherein said ion beam comprises argon ions having an energy of between 20 KeV and 200 Key and at current of 4 milliamps to 15 milliamps.

20. The method of claim 13, wherein said voltage applied to said center aperture is negative at least 2.5 KeV.

* * * * *